United States Patent [19]

Benson et al.

[11] Patent Number: 4,992,624

[45] Date of Patent: Feb. 12, 1991

[54] MAGNETIC SHIELD FOR VISUAL DISPLAY TERMINALS

[75] Inventors: Brian L. Benson, Roseville; Carl R. Haynie, Carmichael, both of Calif.

[73] Assignee: Hewlett-Packard Company, Palo Alto, Calif.

[21] Appl. No.: 365,075

[22] Filed: Jun. 12, 1989

[51] Int. Cl.[5] .......... H05K 9/00

[52] U.S. Cl. .......... 174/35 R; 174/35 MS

[58] Field of Search .......... 174/35 MS, 35 R, 36, 174/102 R, 103, 104, 105 R, 106 R, 108, 109

[56] References Cited

U.S. PATENT DOCUMENTS

| | | | |
|---|---|---|---|
| 4,598,165 | 7/1986 | Tsai | 174/36 |
| 4,647,714 | 3/1987 | Goto | 174/36 |
| 4,896,001 | 1/1990 | Pitts et al. | 174/35 MS |

*Primary Examiner*—Leo P. Picard

*Assistant Examiner*—Bot Lee Ledynh

[57] ABSTRACT

A magnetic shield is designed to be retrofitted over a flyback transformer of a cathode ray tube display terminal. The magnetic shield consists of a layer of metal conductor, for example mu metal, and a layer of insulation, for example polyester film. The layer of insulation is placed upon the layer of metal conductor and the layers are rolled to form a spiral having greater than two windings. Tape may be used to secure the shape of the spiral. Additionally foam rubber pads may be attached to the inside of the spiral to provide a secure mechanical mounting to the flyback transformer and to provide air spacing as additional insulation against corona discharge. Also shrink tubing may be placed over the spiral to provide additional support to the spiral shape and to provide heat and electrical insulation.

11 Claims, 4 Drawing Sheets

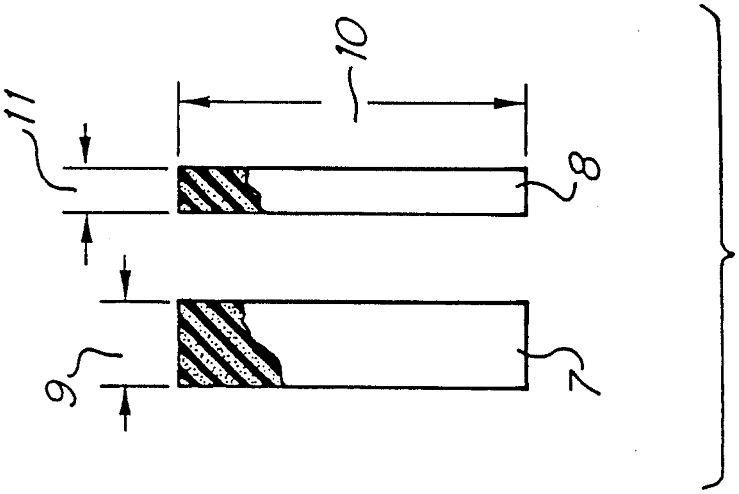
Figure 3
Figure 1
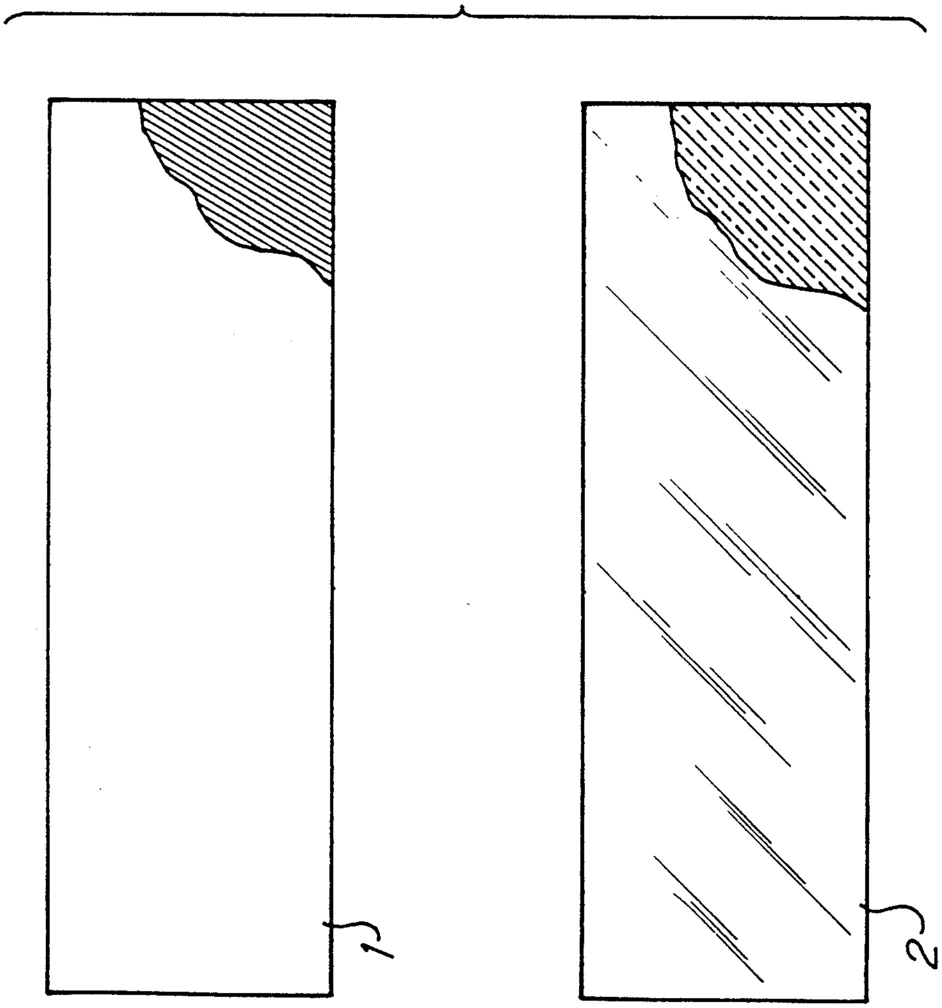

MAGNETIC SHIELD FOR VISUAL DISPLAY TERMINALS

BACKGROUND

The present invention concerns the shielding of magnetic pulses generated by a flyback transformer in a visual display terminal.

Within a typical cathode ray tube terminal there are three main sources of magnetic fields. The flyback transformer is the largest source of magnetic fields, followed by the deflection yoke and the width and linearity coils.

In the prior art various methods have been used to shield the magnetic fields. For example, deflection yoke stray magnetic fields have been cancelled by attaching additional windings to the yoke. Current through these windings create an equal but opposite magnetic field to the undesired stray magnetic fields. Also metal shields have been placed around the flyback transformer. These metal shields have made of a single layer of metal or two concentric layers of metal separated by an insulating layer.

SUMMARY OF THE INVENTION

In accordance with the preferred embodiment of the present invention a magnetic shield is presented. The magnetic shield is designed to be retrofitted over a flyback transformer of a cathode ray tube display terminal. The magnetic shield consists of a layer of metal conductor, for example mu metal, and a layer of insulation, for example polyester film. The layer of insulation is placed upon the layer of metal conductor and the layers are rolled to form a spiral having greater than two windings. Tape may be used to secure the shape of the spiral. Additionally foam rubber pads may be attached to the inside of the spiral to provide a secure mechanical mounting to the flyback transformer and to provide air spacing as additional insulation against corona discharge. Also shrink tubing may be placed over the spiral to provide additional support to the spiral shape and to provide heat and electrical insulation.

The advantages of the present invention include the ability to retrofit the metal shield on existing terminals, inexpensive manufacture, and effective shielding of magnetic signals.

BRIEF DESCRIPTION OF THE DRAWINGS

FIG. 1 shows a Mylar sheet and a mu metal sheet used to form a spiral shield in accordance with the preferred embodiment of the present invention.

FIG. 3 shows foam rubber pads used to provide insulation and support to the spiral shield shown in FIG. 2 when the spiral shield shown in FIG. 2 is placed over a flyback transformer in accordance with the preferred embodiment of the present invention.

DESCRIPTION OF THE PREFERRED EMBODIMENT

In FIG. 1 is shown a sheet 1 of approximately four mil thick mu metal, for example Magnalloy, mil specification N-14411C, Composition 1, available from Magnetic Radiation Laboratories having a business address of 92A N. Lively Boulevard, Elk Grove Village, Ill. 60007. Sheet 1 is, for example, five centimeters by one hundred twenty-five centimeters. FIG. 1 also shows a sheet 2 of three mil thick Mylar available, for example, from Brandywine Fibre Products Company having a business address of 1465 Poplar Street, Wilmington, Del., 19801. Mu metal is used because it provides high magnetic permeability. Sheet 2 also measures five centimeters by one hundred twenty-five centimeters. In order to form a magnetic shield sheet 2 may be placed upon sheet 1 and rolled.

Figure 2:
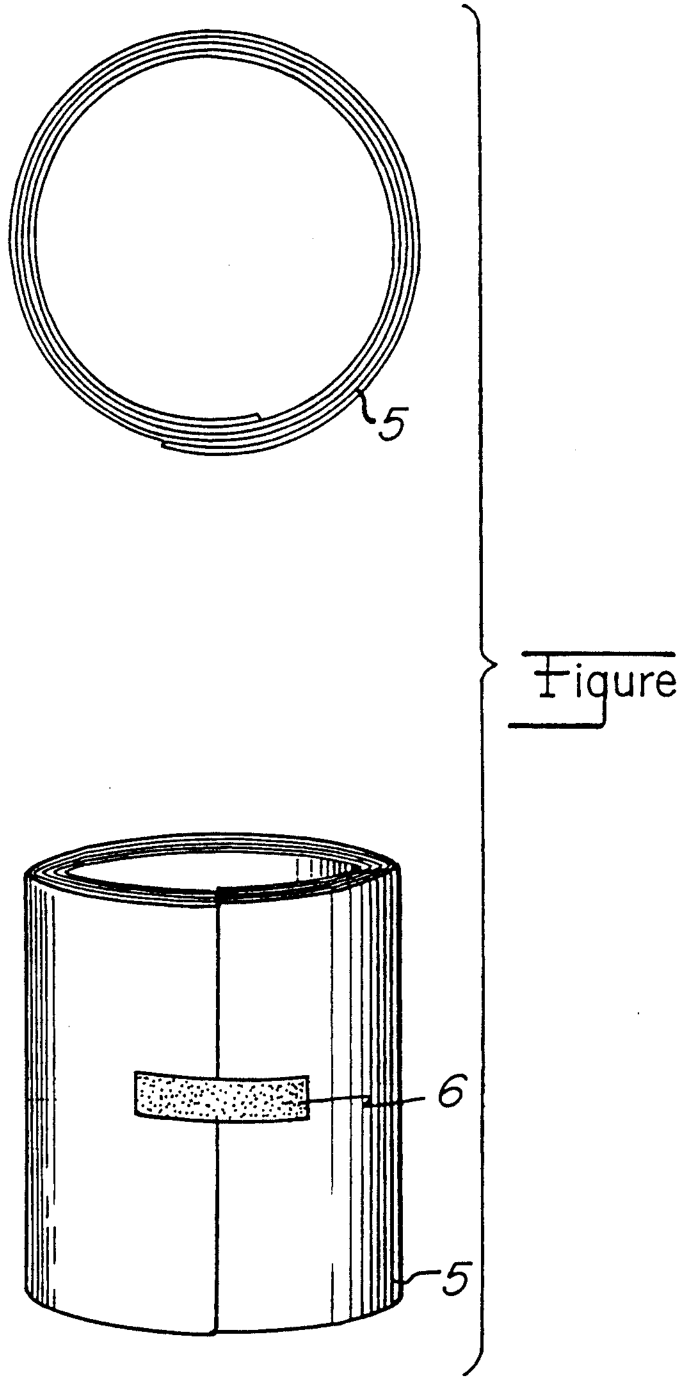
FIG. 2 shows a top view and a side view of a spiral shield in accordance with the preferred embodiment of the present invention.

FIG. 2 shows a top view and a side view of a spiral magnetic shield 5 formed by placing sheet 2 upon sheet 1 and rolling the sheets. In the preferred embodiment spiral metal shield 5 has seven and one half windings. The result is that spiral metal shield 5 is shaped as a cylinder with a diameter of approximately five and three-tenths centimeters. At inside of circumference of spiral magnetic shield 5 Mylar sheet 2 is exposed. At the outside circumference of magnetic shield 5 mu metal sheet 1 is exposed. Spiral metal shield 5 may be held together, for example, with a single piece of Mylar tape 6.

FIG. 3 shows a front view of a foam rubber insulator pad 7 and a side view of a foam rubber insulator pad 8. Pad 7 and pad 8 are identical, each having a width 9 of approximately 12.7 millimeters, a height 10 of approximately 5 centimeters and a depth 11 of approximately 6.3 millimeters. Foam rubber insulator pads 7 and 8 may be, for example, single side adhesion foam pads available as part number COHR R10460 from Boyd Corporation having a business address of 2209 Fairview Drive, Ceres, Calif. 95307.

Figure 4:
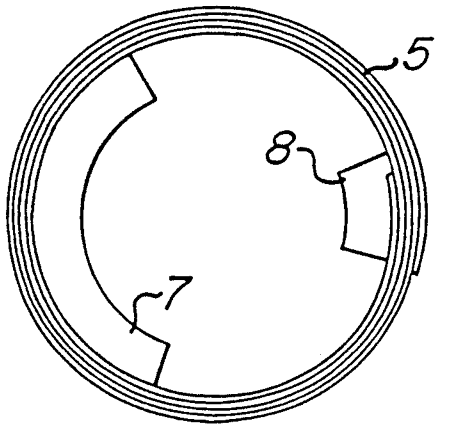
FIG. 4 shows the foam rubber pads shown in FIG. 3 attached to the spiral shield shown in FIG. 2 in accordance with the preferred embodiment of the present invention.

FIG. 4 shows pads 7 and 8 attached to the inside of spiral magnetic shield 5. Pads 7 and 8 provide support to and insulation of spiral magnetic shield 5 when spiral magnetic shield 5 is mounted over a flyback transformer.

Figure 5:
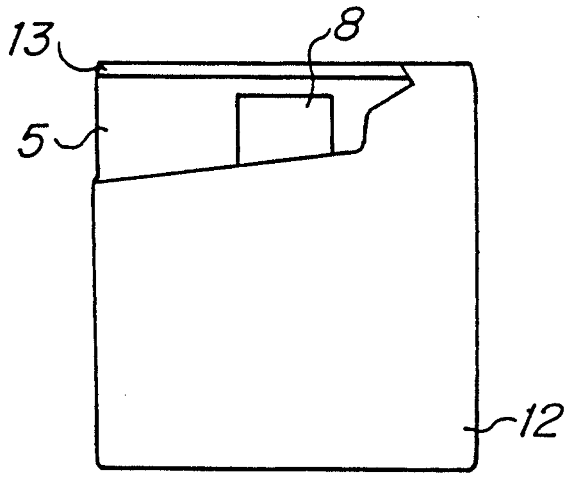
FIG. 5 shows shrink tubing placed over the spiral shield shown in FIG. 2 in accordance with the preferred embodiment of the present invention.

FIG. 5 is a cut away view showing shrink tubing 12 placed over spiral magnetic shield 5. Shrink tubing 12 may be obtained, for example, from Thermofit Division of Raychem Corporation, having a business address of 300 Constitution Drive, Menlo Park, Calif. 94025. Shrink tubing 12 provides additional support keeping spiral shield 5 tightly rolled. Additionally shrink tubing 12 provides heat and electrical insulation over the outside of spiral shield 5. Shrink tubing is approximately two and one half inches tall, allowing for an overlap portion 13 forming an approximately one fourth inch lip over the top of spiral shield 5 and the bottom of spiral shield 5.

Figure 6:
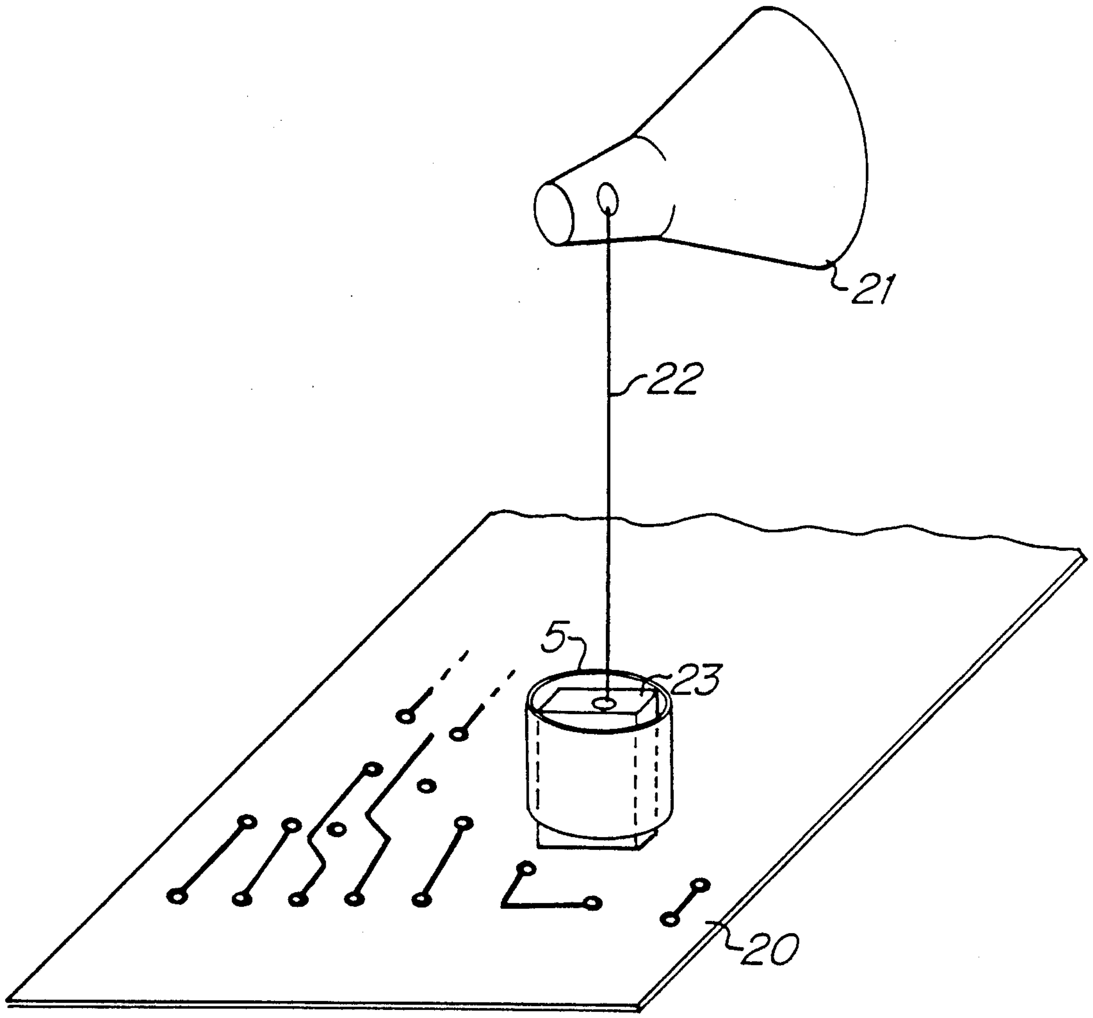
FIG. 6 shows the spiral shield shown in FIG. 2 placed over a flyback transformer of a cathode ray tube display terminal in accordance with the preferred embodiment of the present invention.

FIG. 6 shows spiral shield 5 placed over a flyback transformer 23 on a circuit board 20. Spiral shield 5 may be easily retrofitted by removing a flyback transformer wire 22 from a cathode ray tube 21. Then spiral shield 5 may be placed over flyback transformer 23 and flyback transformer wire 22 re-attached.

The present invention provides advantages over the prior art. For example, the use of several thin layers as in the present invention rather than a few thick layers allows greater attenuation of stray magnetic fields in the same or comparable amounts of volume. Also, the multiple layered nature of the present invention results in the construction of a shield with a very ductile spring. This makes it easy to install the shield and assures that the shield will stay in place better than prior art shields.

I claim:

1. A magnetic shield for being placed over a flyback transformer of a cathode ray tube display terminal and for reducing magnetic pulse and field emissions from the flyback transformer, the magnetic shield comprising:

a sheet of metal conductor; and, a sheet of insulation, the sheet of insulation being placed upon the sheet of metal conductor and the sheets rolled to form a spiral having greater than two windings the spiral having a ductile springiness;

attachment means for holding the sheet of insulation and the sheet of metal conductor in a rolled spiral shape.

2. A magnetic shield as in claim 1 wherein the sheet of metal conductor comprises mu metal and the sheet of insulation comprises polyester film.

3. A magnetic shield as in claim 1 wherein the attachment means comprises tape.

4. A magnetic shield as in claim 1 wherein the attachment means comprises shrink tubing.

5. A magnetic shield as in claim 1 additionally comprising foam rubber strips attached to the sheet of insulation at the inside of the rolled spiral shape and serving to provide contact with the flyback transformer.

6. A magnetic shield for being retrofitted over a flyback transformer of a cathode ray tube display terminal and for reducing magnetic field and pulse emissions from the flyback transformer comprising:

a sheet of metal conductor;

a sheet of insulation; and, attachment means for holding the sheet of insulation and the sheet of metal conductor in a rolled spiral shape;

wherein the sheet of insulation is placed upon the sheet of metal conductor and the sheets are rolled to form a spiral having greater than two windings, the spiral having a ductile springiness.

7. A magnetic shield as in claim 6 wherein the sheet of metal conductor comprises mu metal and the sheet of insulation comprises polyester film.

8. A method for reducing magnetic pulse and fields emissions from a flyback transformer of a cathode ray tube terminal, the method comprising the steps of:

(a) rolling a conductive metal sheet and an insulator sheet together to form a spiral shield with greater than two windings, the spiral shield having a ductile springiness.

(b) Attaching insulating pads to the inside of the spiral shield; and, (c) placing the spiral shield over the flyback transformer.

9. A method as in claim 8 wherein step (a) includes taping the rolled conductive metal sheet to prevent the spiral shield from unwinding.

10. A method as in claim 8 wherein before step (c) shrink tubing is placed over the spiral shield.

11. A method as in claim 8 wherein the conductive metal sheet is comprised of mu metal and the insulator sheet is comprised of polyester film.

* * * * *